(12) United States Patent
Chen et al.

(10) Patent No.: US 10,619,480 B2
(45) Date of Patent: Apr. 14, 2020

(54) MULTIPLE DEPTH OF INVESTIGATION NUCLEAR MAGNETIC RESONANCE LOGGING FOR DETERMINING THE POROSITY AND PORE TYPE OF SUBTERRANEAN FORMATIONS

(71) Applicant: Halliburton Energy Services, Inc., Houston, TX (US)

(72) Inventors: Songhua Chen, Katy, TX (US); Rebecca Corina Jachmann, Spring, TX (US); Arcady Reiderman, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 408 days.

(21) Appl. No.: 15/513,975

(22) PCT Filed: Mar. 4, 2016

(86) PCT No.: PCT/US2016/020804
§ 371 (c)(1),
(2) Date: Mar. 23, 2017

(87) PCT Pub. No.: WO2017/151140
PCT Pub. Date: Sep. 8, 2017

(65) Prior Publication Data
US 2018/0347351 A1 Dec. 6, 2018

(51) Int. Cl.
*G01V 3/32* (2006.01)
*G01N 15/08* (2006.01)
(Continued)

(52) U.S. Cl.
CPC .......... *E21B 49/00* (2013.01); *G01N 15/088* (2013.01); *G01V 3/32* (2013.01); *G01R 33/448* (2013.01)

(58) Field of Classification Search
CPC .... G01N 24/081; G01N 15/088; E21B 49/00; G01V 3/32
(Continued)

(56) References Cited

U.S. PATENT DOCUMENTS

| 6,040,696 A | 3/2000 | Ramakrishnan et al. |
| 2003/0001569 A1 | 1/2003 | Chen et al. |

(Continued)

FOREIGN PATENT DOCUMENTS

| CA | 2693917 | 1/2009 |
| WO | 2007002678 A2 | 1/2007 |
| WO | 2008115969 A1 | 9/2008 |

OTHER PUBLICATIONS

Canadian Office Action for Application No. 2,962,364 dated May 8, 2018.
(Continued)

*Primary Examiner* — Reena Aurora
(74) *Attorney, Agent, or Firm* — Jason Sedano; C. Tumey Law Group PLLC

(57) ABSTRACT

Nuclear magnetic resonance methods may be used to determine the porosity and the pore type of subterranean formations while accounting for fluid infiltration from the drilling mud or mud filtrate thereof into the formation. For example, the apparent porosity of (1) a shallow sensitive volume ($\phi_{sh}$) and (2) a deep sensitive volume ($\phi_{deep}$) may be measured. Then, a comparison of the $\phi_{sh}$ and the $\phi_{deep}$ may be performed, and the porosity ($\phi$) of a portion of the subterranean formation may be calculated based on the comparison of the $\phi_{sh}$ and the $\phi_{deep}$.

14 Claims, 4 Drawing Sheets

(51) Int. Cl.
*E21B 49/00* (2006.01)
*G01R 33/44* (2006.01)

(58) Field of Classification Search
USPC .......................................................... 324/303
See application file for complete search history.

(56) References Cited

U.S. PATENT DOCUMENTS

| | | |
|---|---|---|
| 2003/0006767 A1 | 1/2003 | Georgi et al. |
| 2004/0027122 A1 | 2/2004 | Heaton et al. |
| 2011/0129357 A1 | 6/2011 | Jennings et al. |
| 2013/0113479 A1 | 5/2013 | Chen et al. |
| 2015/0285944 A1* | 10/2015 | Herron ................. G01N 33/246 |
| | | 250/269.6 |
| 2017/0205527 A1* | 7/2017 | Coman ..................... G01V 3/32 |
| 2017/0254919 A1* | 9/2017 | Coman ................... E21B 47/12 |

OTHER PUBLICATIONS

Clerke et al., "Application of Thomeer Hyperbolas to Decode the Pore Systems, Facies and Reservoir Properties of the Upper Jurassic Arab D Limestone, Ghawar Field, Saudi Arabia: A 'Rosetta Stone' Approach," GeoArabia, 2008, pp. 113-160, vol. 13, No. 4, Gulf PetroLink, Bahrain.
International Search Report and Written Opinion for PCT/US2016/020804, dated Nov. 30, 2016.

* cited by examiner

MULTIPLE DEPTH OF INVESTIGATION NUCLEAR MAGNETIC RESONANCE LOGGING FOR DETERMINING THE POROSITY AND PORE TYPE OF SUBTERRANEAN FORMATIONS

BACKGROUND

The exemplary embodiments described herein relate to nuclear magnetic resonance (NMR) logging for determining the porosity and the pore type of subterranean formations.

When drilling a wellbore penetrating a subterranean formation, the drilling fluid (or drilling mud) infiltrates into the formation surrounding the wellbore. This infiltration occurs over multiple steps. Initially, as the drill bit exposes the formation, the drilling mud, including solid particles like weighting agents and drill cuttings, migrates into the pore spaces of the formation that is close to the wellbore wall. During this step of drilling mud infiltration, the solids form an internal mud cake in the formation at the wellbore by bridging the pores in the formation. As the internal mud cake forms, the fluid in the drilling mud readily flows into the formation, which is sometimes referred to as spurt invasion. Then, after the internal mud cake forms and pore bridging stabilizers, an external mud cake starts to build up on the wellbore wall. As the external mud cake begins to form, the fluid in the drilling mud infiltrates into the surrounding formation to a lesser degree by a mechanism known as transient invasion or static invasion. As the external mud cake thickens, infiltration of the fluid of drilling mud into the surrounding formation decreases until a steady state is reached. Even though it can take hours to build up an external mud cake of 2.5 mm, the most significant amount of fluid infiltration from the drilling mud into the surrounding formation is believed to occur within a few seconds.

NMR tools are often used to analyze the properties of the formation close to the wellbore such as porosity and pore type. Generally, the NMR tool produces a radiofrequency (RF) excitation pulse that penetrates into the formation and interacts with the fluids therein. This interaction then produces an NMR signal that is measured by the NMR tool. Depending on the RF excitation pulse and NMR signal detection parameters, various NMR properties may be measured. Because NMR measurements interrogate the composition of the fluid that interacts with the RF excitation pulse, the amount of fluid infiltration from drilling muds can affect NMR measurements and the formation properties derived. For logging-while-drilling (LWD) NMR measurements, the fluid composition in the portion of the formation being interrogated is changing due to the spurt invasion and transient invasion, which increases the error associated with the NMR measurements and the formation properties derived therefrom.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1:
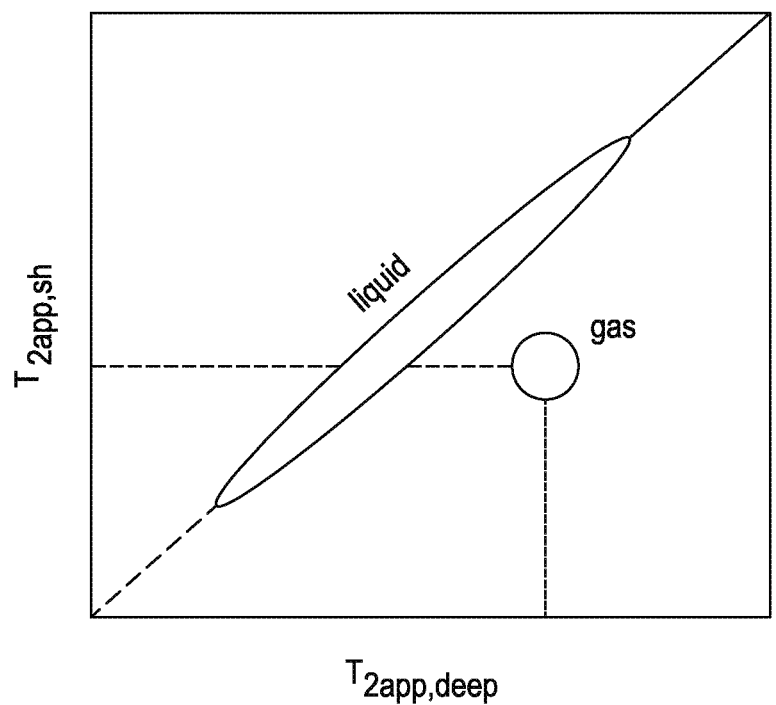
FIG. 1 a 2-dimensional plot of $T_{2app,sh}$ vs. $T_{2app,deep}$ for the two Carr-Purcell-Meiboom-Gill (CPMG) sequences described in Equation 8.

The exemplary embodiments described herein relate to NMR methods for determining the porosity and the pore type of subterranean formations while accounting for fluid infiltration from the drilling mud or mud filtrate thereof into the formation. The NMR methods described herein may be performed with logging while drilling (LWD) NMR tools, measurement while drilling (MWD) NMR tools, wireline NMR tools, slickline NMR tools, and the like.

As used herein, the term "whole mud" refers to the drilling mud including the fluid and solid particles therein. As used herein, the term "mud filtrate" refers to the fluid of the drilling mud that is filtered during infiltration into the surrounding formation.

As used herein, the term "porosity" refers to a measure of how much of a rock or other material is open space (i.e., not solid).

As used herein, the term "sensitive volume" refers to the volume of the formation investigated by NMR. The thickness of the sensitive volume is determined by the RF excitation pulse parameters (e.g., the bandwidth of the RF refocusing pulse in a Carr-Purcell-Meiboom-Gill (CPMG) echo train decay) and the magnetic field gradient of the logging instrument.

Generally, the amplitude of the NMR signal from a fluid is proportional to the number of protons in the sensitive volume. With proper calibration, NMR signal amplitude may be converted to proton density in the sensitive volume. In porous rocks, the NMR signal amplitude (represented by A) is proportional to the apparent porosity of the formation (represented by $\phi_{app}$) is given by Equation 1, where C is the calibration constant, is the porosity, HI is the hydrogen index, and s is the saturation (on a scale of 0-1 based on the % of the fluid composition) and where the subscripts w, o, and g are the water, oil, and gas components of the fluid in the sensitive volume, respectively.

$$A = C^*\phi_{app} = (S_w^* HI_w + S_o^* HI_o + S_g^* HI_g)^* \phi \qquad \text{Equation 1}$$

The calibration constant (C) may be determined by measuring the NMR signal amplitude of a filled tank ($S_w=1$) with a fluid having known $HI_w$, which has $\phi=100\%$. Typically, the HI for water and oil are substantially close to 1. A slight deviation may be observed to high salinity water. Additionally, slight deviations in $HI_o$ may be observed based on the density of the oil ($\rho_o$). Equation 2 provides an estimation of $HI_o$.

$$HI_o = 9\rho_o(0.15 + 0.2(0.9 - \rho_0)^2) \qquad \text{Equation 2}$$

In downhole applications, the most uncertainty with deriving $\phi$ is from the gas present in the sensitive volume because $HI_g$ is typically much less than 1. Typically, in high-pressure virgin gas reservoirs $HI_g$ is about 0.4. However, for depleted gas reservoirs the $HI_g$ can be significantly lower.

Additionally, in formations with or without significant gas concentrations, uncertainty with deriving $\phi$ can be a result of the sensitive volume and, consequently, the $\phi_{app}$ not being representative of the formation. For example, vibration or radial movement of the NMR tool and wellbore rugosity (i.e., small-scale variations in the wellbore surface) may cause the sensitive volume to be partially inside the wellbore where the mud porosity is much higher than formation porosity because much of the mud is liquid and not solid. Having the sensitive volume to be partially inside the wellbore artificially increases the $\phi_{app}$ and, consequently, the $\phi$. In another example, the solids present in the drilling mud may penetrate into the sensitive volume, which is volume that would otherwise be occupied by a fluid. This artificially decreases the $\phi_{app}$ and, consequently, the $\phi$.

To reduce the uncertainty induced by the foregoing issues, the present application measures the $\phi_{app}$ for two or more sensitive volumes and, then, compares the $\phi_{app}$ of each of the sensitive volumes for quality control in determining $\phi$.

As used herein, the terms "$\phi_{sh}$" refers to the apparent porosity corresponding to a shallow sensitive volume that is closer to the NMR tool than a deep sensitive volume. Further, "$\phi_{deep}$" refers to the apparent porosity corresponding the deep sensitive volume. That is, the shallow sensitive volume at a smaller radial distance from the NMR (or wellbore) than the deep sensitive volume.

The NMR properties that may be measured as $\phi_{app}$ include a spin-lattice relaxation time (T1), a spin-spin relaxation time (T2), or a Carr-Purcell-Meiboom-Gill (CPMG) echo train decay.

In a liquid-bearing formation where the above described concerns with gas are minimal, $\phi_{sh} \cong \phi_{deep}$ (e.g., within about 5% of each other) may indicate that $\phi_{sh}$ is representative of the formation. Accordingly, $\phi_{sh}$, $\phi_{deep}$, or an average thereof may be used as $\phi_{app}$ to calculate $\phi$.

In a liquid-bearing formation where the above described concerns with gas are minimal, $\phi_{sh} > \phi_{deep}$ may indicate that drilling mud (also referred to as whole mud) are contributing to part of $\phi_{sh}$, which may be due to vibration or radial movement of the NMR tool and wellbore rugosity. Accordingly, $\phi_{deep}$ may be used as $\phi_{app}$ to calculate $\phi$.

In a liquid-bearing formation where the above described concerns with gas are minimal, $\phi_{sh} < \phi_{deep}$ may indicate pore bridging in the shallow sensitive volume, which is caused by solids from the drilling mud infiltrating the shallow sensitive volume. Accordingly, $\phi_{deep}$ may be used as $\phi_{app}$ to calculate $\phi$.

In a gas-bearing formation, in addition to comparing $\phi_{sh}$ and $\phi_{deep}$, the presence, absence, or magnitude of the NMR signal corresponding to (1) the mud filtrate (referred to herein as a "characteristic mud filtrate NMR signal" or "NMR$_{filtrate}$"), (2) the whole mud (referred to herein as a "characteristic whole mud NMR signal" or "NMR$_{mud}$"), or (3) both may be used to determine the extent to which the respective fluid has infiltrated into the formation. Such infiltration information may then be used to determine which of $\phi_{sh}$ or $\phi_{deep}$ to use as $\phi_{app}$ when calculating $\phi$. Additionally, depending on the calculation, the wetting or non-wetting characteristics of the mud filtrate may be of interest. Accordingly, the NMR signal corresponding to the wetting or non-wetting mud filtrate are referred to herein as a "characteristic wetting mud filtrate NMR signal" (or "NMR$_{wet}$") and the "characteristic non-wetting mud filtrate NMR signal" (or "NMR$_{nw}$"), respectively.

As used herein, "wetting fluids" refers to fluids that maintain good contact with a solid surface, specifically the subterranean formation, resulting from attractive intermolecular interactions between the fluid and the mineral molecules on the surface. Conversely, a "non-wetting fluid," as used herein, refers to a fluid that minimizes contact with a solid surface, specifically the subterranean formation, when the fluid and the surface are brought together.

In a gas-bearing formation, $\phi_{sh} > \phi_{deep}$ may indicate that the mud filtrate has infiltrated the shallow sensitive volume more significantly than the deep sensitive volume. The NMR$_{filtrate}$ may be used to determine the extent to which the fluid has infiltrated into the formation. For example, when $T_2$ distribution is the NMR signal measured in the sensitive volumes, the presence of the characteristic mud filtrate NMR signal ($T_{2,filtrate}$) in the $T_{2,sh}$ may indicate that mud filtrate has at least partially infiltrated the shallow sensitive volume.

In a gas-bearing formation when $\phi_{sh} > \phi_{deep}$ and the NMR$_{mud}$ is not observed in either the shallow or deep sensitive volumes, the whole drilling mud may not have infiltrated the sensitive volumes. Accordingly, the solids of the drilling mud would not be interfering with the NMR signal in the shallow sensitive volume, and $\phi_{sh}$ may be used as $\phi_{app}$ to calculate $\phi$.

In a gas-bearing formation for $\phi_{sh} > \phi_{deep}$ and the NMR$_{mud}$ is observed in the shallow sensitive volume and not in the deep sensitive volume, the shallow sensitive volume is contaminated with signal from the whole mud, which may be due to wellbore rugosity and/or movement/vibrations of the NMR tool. In such instances, the $\phi_{app}$ may be computed from the sum of the true non-movable (bound water) porosity ($\phi_{bw,true}$) and the true movable porosity ($\phi_{mv,true}$), where the true movable and non-movable porosities may be taken from different sensitive volumes.

$T_{2cutoff}$ corresponds to the size boundary between small pores containing bound fluid and larger pores containing free fluids and may be used to determine the portions of the NMR signal used to calculate or approximate each of $\phi_{mv,true}$ and $\phi_{bw,true}$.

Because the corresponding $T_2$ of the NMR$_{mud}$ usually is below the $T_{2cutoff}$, calculating the bound water from deeper sensitive volume measurement is more accurate (i.e., $\phi_{bw,true} \approx \phi_{bw,deep}$). The $\phi_{bw,deep}$ may be calculated by integrating the partial porosities corresponding to $T_2 \leq T_{2cutoff}$.

The NMR signal from the shallow sensitive volume may be used to calculate or approximate $\phi_{mv,true}$. More specifically, $\phi_{mv,true}$ relates to the movable porosity in the shallow sensitive volume ($\phi_{mv,sh}$) by Equation 3, wherein f is the fraction of the sensitive volume being contaminated with the whole mud. Further, the non-moveable porosity of the shallow sensitive volume ($\phi_{bw,sh}$) can be represented by Equation 4, where $\phi_{mud}$ is the whole mud porosity. Then, given that $\phi_{bw,true} \approx \phi_{bw,deep}$, as described above, Equation 5 can be derived for calculating f. By combining Equations 4 and 5, Equation 6 is derived for calculating $\phi_{app}$.

$$\phi_{mv,sh} = \phi_{mv,true}(1-f) \qquad \text{Equation 3}$$

$$\phi_{bw,sh} = \phi_{bw,true}(1-f) + f\phi_{mud} \qquad \text{Equation 4}$$

$$f = \frac{\phi_{bw,sh} - \phi_{bw,deep}}{\phi_{mud} - \phi_{bw,deep}} \qquad \text{Equation 5}$$

$$\phi_{mv,true} = \phi_{mv,sh}\left(\frac{\phi_{mud} - \phi_{bw,deep}}{\phi_{mud} - \phi_{bw,sh}}\right) \qquad \text{Equation 6}$$

Accordingly, $\phi_{app}$, which as described above is $\phi_{bw,true} + \phi_{mv,true}$, may be calculated according to Equation 7 for a gas-bearing formation when $\phi_{sh} > \phi_{deep}$ and the NMR$_{mud}$ is observed in the shallow sensitive volume and not in the deep sensitive volume.

$$\phi_{app} = \phi_{bw,deep} + \phi_{mv,sh}\left(\frac{\phi_{mud} - \phi_{bw,deep}}{\phi_{mud} - \phi_{bw,sh}}\right) \quad \text{Equation 7}$$

In a gas-bearing formation, $\phi_{sh} < \phi_{deep}$, where the long relaxation components of the NMR signal are lower and the short relaxation components in the NMR signal are greater for the shallow sensitive volume as compared to the deep sensitive volume, may indicate that the solids from the drilling fluid have infiltrated into the shallow sensitive volume because long relaxation components of an NMR response in porous media typically correspond to fluids in larger pores and short relaxation components of an NMR response in porous media typically correspond to fluids in smaller pores, and the solids infiltrated into the larger pores in the formation, causing the reduction of the number of the large-sized pores and increase of the number of the smaller pores. Accordingly, $\phi_{deep}$ may be used as $\phi_{app}$ to calculate $\phi$.

In a gas-bearing formation, $\phi_{sh} \cong \phi_{deep}$ may indicated either no fluid has infiltrated the two sensitive volumes or fluid has completely infiltrated the two sensitive volumes.

For $\phi_{sh} \cong \phi_{deep}$ when the continuous fluid phase in the mud is the non-wetting phase such as oil and the $NMR_{nw}$ is present in both the shallow sensitive volume and the deep sensitive volume, the mud filtrate has infiltrated both sensitive volumes. The non-wetting phase of the drilling mud fluid is used to determine the presence or absence of infiltration when $\phi_{sh} \cong \phi_{deep}$ because the relaxation time of which is not affected by the pore size. Accordingly, $\phi_{sh}$, $\phi_{deep}$, or an average thereof may be used as $\phi_{app}$ to calculate $\phi$.

For $\phi_{sh} \cong \phi_{deep}$ when the continuous fluid phase in the mud is the non-wetting phase such as oil and $NMR_{nw}$ is not detected in the sensitive volumes, neither of the sensitive volumes are infiltrated with a significant amount of mud filtrate, which may indicate little to no fluid infiltration.

In some instances of little to no fluid infiltration, the differential pressure between the drilling mud in the wellbore and the formation may be increased to force the mud filtrate into at least a portion of the shallow sensitive volume. Then, the measurement and analysis of $\phi_{sh}$ and $\phi_{deep}$ may be undertaken again, such as during the wiping or tripping operation.

In some instances of little to no fluid infiltration, the above methods may be ambiguous for the gas porosity estimation. In such case, a magnetic field gradient-based diffusion analysis may be performed for determining $S_w$ and $S_g$ of Equation 1, which may then be used for calculating $\phi$ according to Equation 1.

For example, additional NMR measurements may be taken in a magnetic field gradient-based diffusion analysis. Exemplary NMR measurements may include at least two CPMG echo trains measurement having different set of G·TE parameter, where G is the logging tool's magnetic field gradient in the corresponding sensitive volume and TE is the interecho time for a CPMG echo train. The two echo trains may be acquired from the same or two different sensitive volumes. In the case that the at least two echo trains are acquired from the same sensitive volume, the two TE are varied. In the case that the at least two echo trains are acquired from different sensitive volumes having different G, it is equally valid to choose the combination $G_{sh} \cdot TE_{sh} > G_{deep} \cdot TE_{deep}$ or the opposite. Practically it may be preferred to apply the larger TE at the sensitive volume where G is also larger to maximize contrast. For instance, if $G_{deep} < G_{sh}$, the logging program is switched to acquire the two CPMGs for the two different sensitive volumes where the interecho times are chosen such that $$\frac{(G_{sh} \cdot TE_{sh})^2}{(G_{deep} \cdot TE_{deep})^2} \gg 1$$

such that sufficient contrast of gas signal in $T_{2app,sh}$ vs. $T_{2app,deep}$ is warranted.

In some instances, the additional NMR measurements may be further analyzed by a joint inversion of the two CPMG sequences described in Equation 8 where the result is displayed in 2-dimensional plot as illustrated in FIG. 1. The decay functions of the two echo trains can be written as Equation 8, where i is the index for the first and second echo trains (i.e., either=sh or deep) and the observed $T_{2i}$ is described by Equation 9.

$$E_i(l \cdot TE) = \sum_{j=1}^{N} \phi_j \exp\left(-\frac{l \cdot TE}{T_{2i,j}}\right) \quad \text{Equation 8}$$

$$\frac{1}{T_{2i}} = \frac{1}{T_{2int}} + \frac{\gamma^2 (GTE)_i^2 D}{12} \quad \text{Equation 9}$$

By choosing $(G \cdot TE)_{sh}$ at the deeper sensitive volume to be significantly larger than $(G \cdot TE)_{deep}$ of the shallow sensitive volume, Equation 10 is derived, which is close to 1 for liquids and significantly greater than 1 only for gases because of the large D coefficient and when $(G \cdot TE)_{sh}$ is chosen to be also sufficiently sensitive for gas $$\frac{T_{2sh}}{T_{2deep}}$$

greater than above 5. For instance, if $G_{deep} = 1$ G/cm, TE=0.4 ms, and $G_{sh} = 2.5$ G/cm, TE=3.5 ms, the gas, $T_{2app}$ and consequently $\phi_{app}$, changes from above 1 sec to about 0.2 sec at 100° C. and 4000 psi.

$$Ratio_{deep:sh} = \frac{T_{2app,deep}}{T_{2app,sh}} = \frac{\frac{1}{T_{2int}} + \frac{\gamma^2 (G \cdot TE)_{sh}^2 D}{12}}{\frac{1}{T_{2int}} + \frac{\gamma^2 (G \cdot TE)_{deep}^2 D}{12}} \approx \left[1 + \frac{\gamma^2 (G \cdot TE)_{sh}^2 D \cdot T_{2int}}{12}\right] \quad \text{Equation 10}$$

The deep sensitive volume echo train can be expressed by Equation 11, and the shallow sensitive volume echo train can be expressed by Equation 12

$$E_{deep}(l \cdot TE) = \sum_{j=1}^{N} \phi_j \exp\left(-\frac{l \cdot TE}{T_{2deep,j}}\right) = \sum_{j=1}^{N} \phi_j \exp\left(-\frac{l \cdot TE}{R_j T_{2sh,j}}\right) \quad \text{Equation 11}$$

$$E_{sh}(l \cdot TE) = \sum_{j=1}^{N} \phi_j \exp\left(-\frac{l \cdot TE}{T_{2app,sh,j}}\right) \quad \text{Equation 12}$$

By jointly inverting these two echo trains, a set of $\mathcal{R} = \{R_j, T_{2app,sh,j}\}$ is obtained. $\mathcal{R}$ is then be converted to the apparent relaxation time set $\mathbb{Q} = \{T_{2app,shsh,j}/R_j, T_{2app,sh,j}\} = \{T_{2app,deep,j}, T_{2app,sh,j}\}$ where $\mathbb{Q}$ is displaced in 2D cross-plot illustrated in FIG. 2 where the liquid and gas signals are separated.

Relative to determining the pore type of the formation (also referred to as pore typing), the NMR relaxation time of the wetting phase of the drilling mud fluid is proportional to the ratio of pore volume (V) to pore surface area (S) as described in Equation 100, where V/S is often considered the pore size, p is surface relaxation, and subscripts 1 and 2 represent $T_1$ and $T_2$, respectively.

$$\frac{1}{T_{1\ or\ 2}} = \frac{1}{T_{1\ or\ 2,bulk}} + \rho_{1\ or\ 2} * \frac{S}{V} \qquad \text{Equation 13}$$

In general, the bulk relaxation rate is much smaller than the second term on the right hand side of Equation 100. Therefore, NMR relaxation times are regarded as proportional to the pore size. Even if the bulk and surface relaxation terms ($T_{1\ or\ 2,bulk}$ and $\rho_{1\ or\ 2}$) in Equation 13 are comparable, the pore structure information still can be derived because the bulk relaxation time is easily measured and accounted for. For those pores that are filled with an oil that does not wet the surface of the pore (a non-wetting fluid), the surface relaxation is very small such that the measured relaxation time is substantially close to the bulk relaxation time value. Therefore, NMR measurement of the non-wetting fluid is insensitive to the pore size information for pores that are saturated with the non-wetting fluid. For pore typing, the pore sizes may be determined from the pores saturated with a wetting fluid like water, which as described herein may be the mud filtrate that infiltrates the formation. Therefore, for the pore typing purpose, the significant wetting phase mud filtrate invasion is preferred and the pore typing is generally preferred to be derived from the shallow sensitive volume.

Due to the possible presence of solid infiltration (pore bridging), borehole rugosity or drilling induced lateral vibration causing whole mud contamination and/or fluid types in the NMR sensitive volume, the same $\phi_{sh}$ and $\phi_{deep}$ described herein relative to porosity may be compared and applied accordingly to determine the pore type of the formation. A description of using $\phi$ for determining pore type is described in U.S. Application No. PCT/US2015/017790.

For pore typing, when $\phi_{sh} > \phi_{deep}$ and no $NMR_{mud}$ is observed in either sensitive volume, the $T_{2,sh}$ may be used for pore typing.

For pore typing, when $\phi_{sh} < \phi_{deep}$ and the long relaxation components of the NMR signal are lower and the short relaxation components in the NMR signal are greater for the shallow sensitive volume as compared to the deep sensitive volume, the $T_{2,deep}$ may be used for pore typing. Additionally, the porosity deficit ($\Delta\phi = \phi_{deep} - \phi_{sh}$) may be used to report near-wellbore formation damage caused by solid particle infiltration.

For pore typing, when $\phi_{sh} \cong \phi_{deep}$, the $T_{2,sh}$, $T_{2,deep}$, or an average thereof may be used for pore typing. The preferred choice, however, is the one which corresponds to minimal G·TE.

For both the porosity and pore typing methods described herein, more than two sensitive volumes may be measured, analyzed, and compared. For example, three sensitive volumes (e.g., shallow, intermediate, and deep) may be measured and compared. Then, for example, $\phi_{sh} \cong \phi_{int} > \phi_{deep}$ may indicate that the mud filtrate has infiltrated the shallow and intermediate sensitive volumes. Accordingly, the $\phi_{sh}$, $\phi_{int}$, or an average thereof may be used for determining $\phi$ and the $T_{2,sh}$, $T_{2,int}$, or an average thereof may be used for pore typing.

Various NMR tool configurations can be used to measure the NMR properties of sensitive volumes at different depths into the formation.

Figure 2:
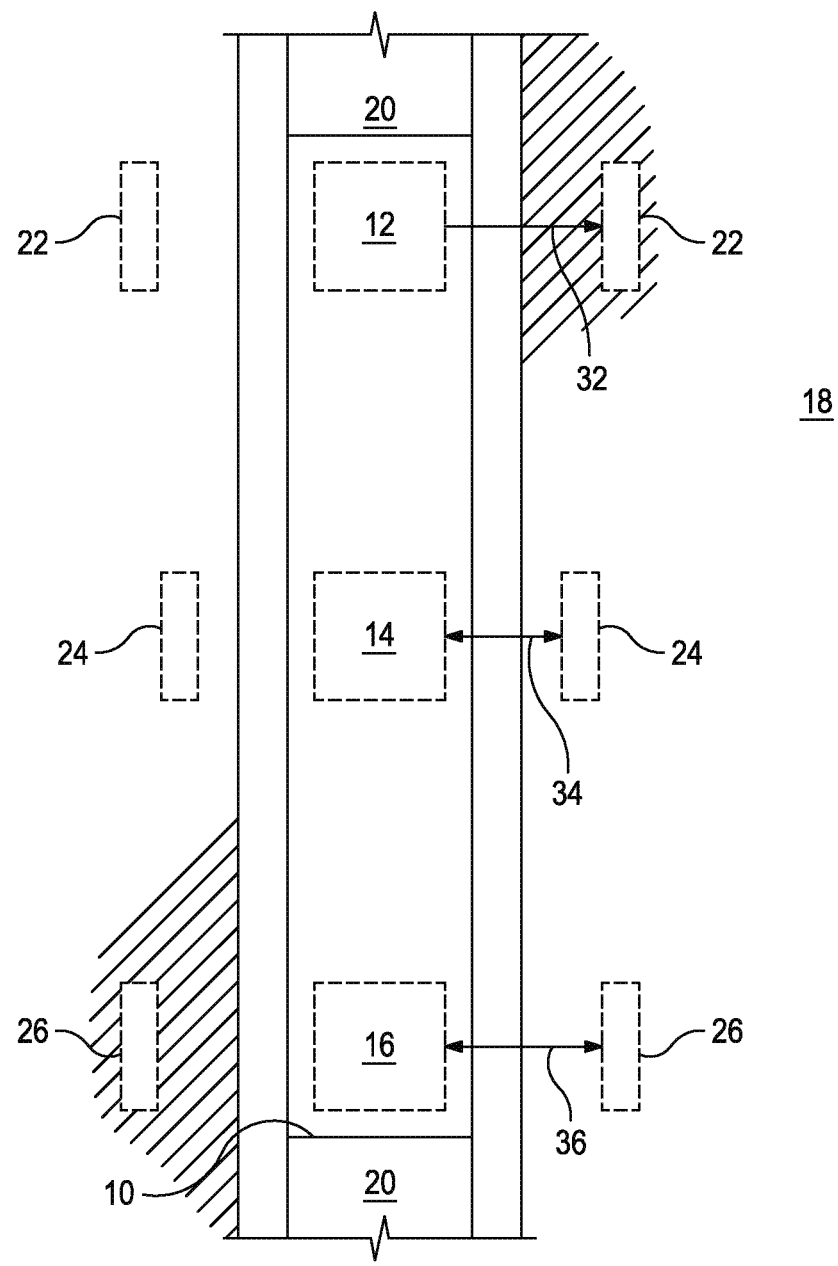
FIG. 2 illustrates an NMR tool for measuring sensitive volumes at different depths into a surrounding subterranean formation.

FIG. 2 illustrates a NMR tool 10 for measuring sensitive volumes 22,24,26 at different depths into a surrounding subterranean formation 18. The NMR tool is arranged along a drill string 20 and includes three NMR RF coils 12,14,16. Each NMR RF coil 12,14,16 is configured to measure corresponding sensitive volumes 22,24,26 at specified radial distances 32,34,36 from the NMR tool. As illustrated, two of the NMR RF coils 12,16 measure sensitive volumes 22,26 at the same radial distances 32,36 into the formation 18. Such a configuration allows for averaging the $\phi_{app}$ at that radial distance 32,36. In alternative embodiments, the radial distances 32,34,36 may be different to allow for measuring $\phi_{sh}$, $\phi_{int}$, and $\phi_{deep}$ described herein.

Other known NMR tool configurations may be implemented to investigate the desired number of sensitive volumes at the desired radial distances from the tool. For example, field shaping may be used when the NMR tool includes a single NMR RF coil.

Figure 3:
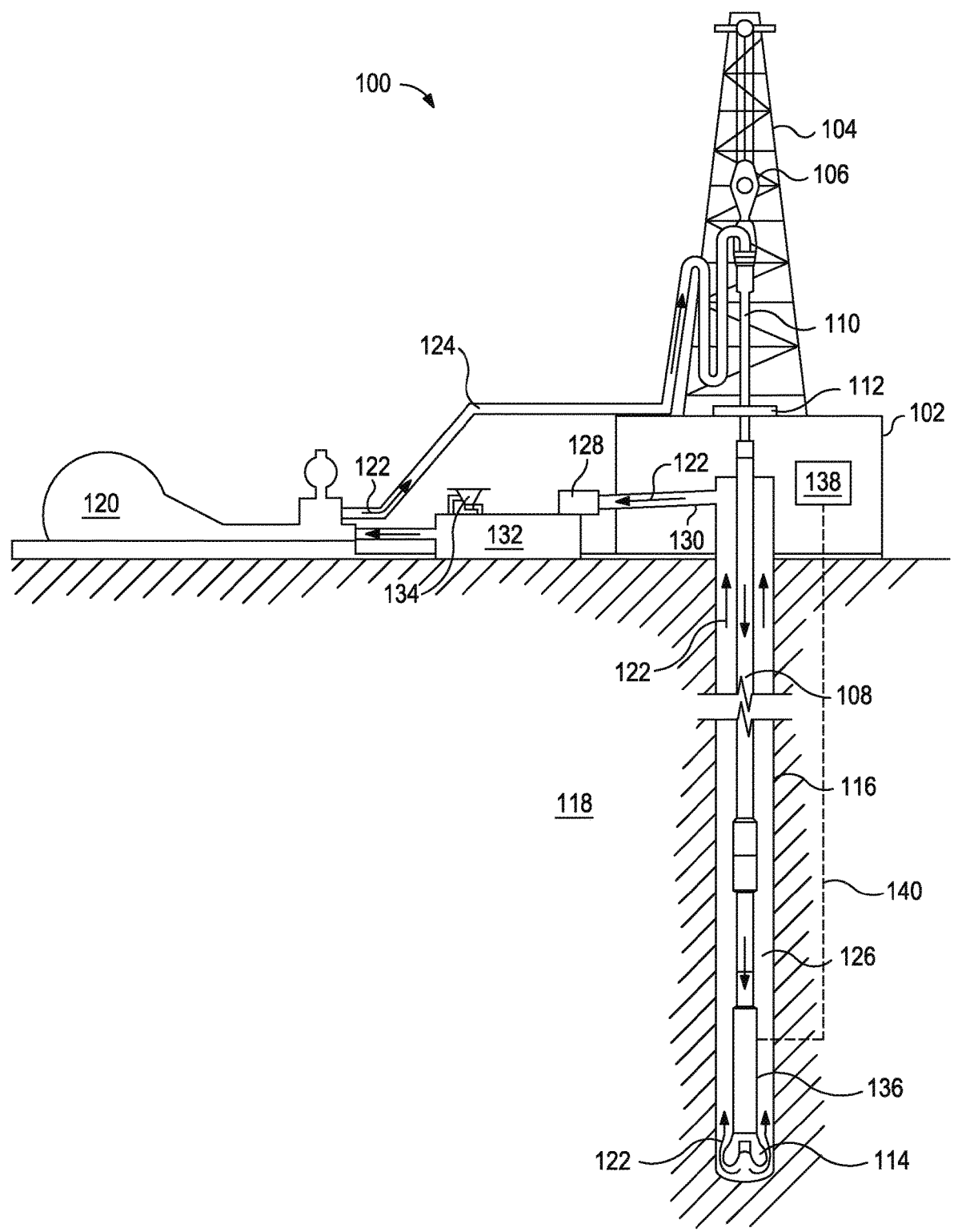
FIG. 3 illustrates an exemplary drilling assembly for implementing the NMR analysis methods described herein.

FIG. 3 illustrates an exemplary drilling assembly 100 for implementing the NMR analysis methods described herein. It should be noted that while FIG. 3 generally depicts a land-based drilling assembly, those skilled in the art will readily recognize that the principles described herein are equally applicable to subsea drilling operations that employ floating or sea-based platforms and rigs, without departing from the scope of the disclosure.

As illustrated, the drilling assembly 100 may include a drilling platform 102 that supports a derrick 104 having a traveling block 106 for raising and lowering a drill string 108. The drill string 108 may include, but is not limited to, drill pipe and coiled tubing, as generally known to those skilled in the art. A kelly 110 supports the drill string 108 as it is lowered through a rotary table 112. A drill bit 114 is attached to the distal end of the drill string 108 and is driven either by a downhole motor and/or via rotation of the drill string 108 from the well surface. As the bit 114 rotates, it creates a wellbore 116 that penetrates various subterranean formations 118. Along the drill string 108 logging while drilling (LWD) or measurement while drilling (MWD) equipment 136 is included.

In the present application, the LWD/MWD equipment 136 may be capable of NMR analysis of the subterranean formation 118 proximal to the wellbore 116. The LWD/MWD equipment 136 may transmit the measured data to a processor 138 at the surface wired or wirelessly. Transmission of the data is generally illustrated at line 140 to demonstrate communicable coupling between the processor 138 and the LWD/MWD equipment 136 and does not necessarily indicate the path to which communication is achieved.

A pump 120 (e.g., a mud pump) circulates drilling mud 122 through a feed pipe 124 and to the kelly 110, which conveys the drilling mud 122 downhole through the interior of the drill string 108 and through one or more orifices in the drill bit 114. The drilling mud 122 is then circulated back to the surface via an annulus 126 defined between the drill string 108 and the walls of the wellbore 116. At the surface, the recirculated or spent drilling mud 122 exits the annulus 126 and may be conveyed to one or more fluid processing unit(s) 128 via an interconnecting flow line 130. After passing through the fluid processing unit(s) 128, a "cleaned" drilling mud 122 is deposited into a nearby retention pit 132 (i.e., a mud pit). While illustrated as being arranged at the outlet of the wellbore 116 via the annulus 126, those skilled in the art will readily appreciate that the fluid processing unit(s) 128 may be arranged at any other location in the drilling assembly 100 to facilitate its proper function, without departing from the scope of the scope of the disclosure.

Chemicals, fluids, additives, and the like may be added to the drilling mud 122 via a mixing hopper 134 communicably coupled to or otherwise in fluid communication with the retention pit 132. The mixing hopper 134 may include, but is not limited to, mixers and related mixing equipment known to those skilled in the art. In other embodiments, however, the chemicals, fluids, additives, and the like may be added to the drilling mud 122 at any other location in the drilling assembly 100. In at least one embodiment, for example, there could be more than one retention pit 132, such as multiple retention pits 132 in series. Moreover, the retention pit 132 may be representative of one or more fluid storage facilities and/or units where the chemicals, fluids, additives, and the like may be stored, reconditioned, and/or regulated until added to the drilling mud 122.

The processor 138 may be a portion of computer hardware used to implement the various illustrative blocks, modules, elements, components, methods, and algorithms described herein. The processor 138 may be configured to execute one or more sequences of instructions, programming stances, or code stored on a non-transitory, computer-readable medium. The processor 138 can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor 138 to perform the process steps described herein. One or more processors 138 in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to the processor 138 for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

FIG. 3 illustrates a drilling assembly 100 where the methods may involve drilling the wellbore 116 while the NMR measurements are made with the LWD/MWD equipment 136. More generally, the methods described herein may involve introducing an NMR tool into the wellbore where the NMR tool may be an LWD NMR tool, a MWD NMR tool, a wireline NMR tool, slickline NMR tool, and the like.

Figure 4:
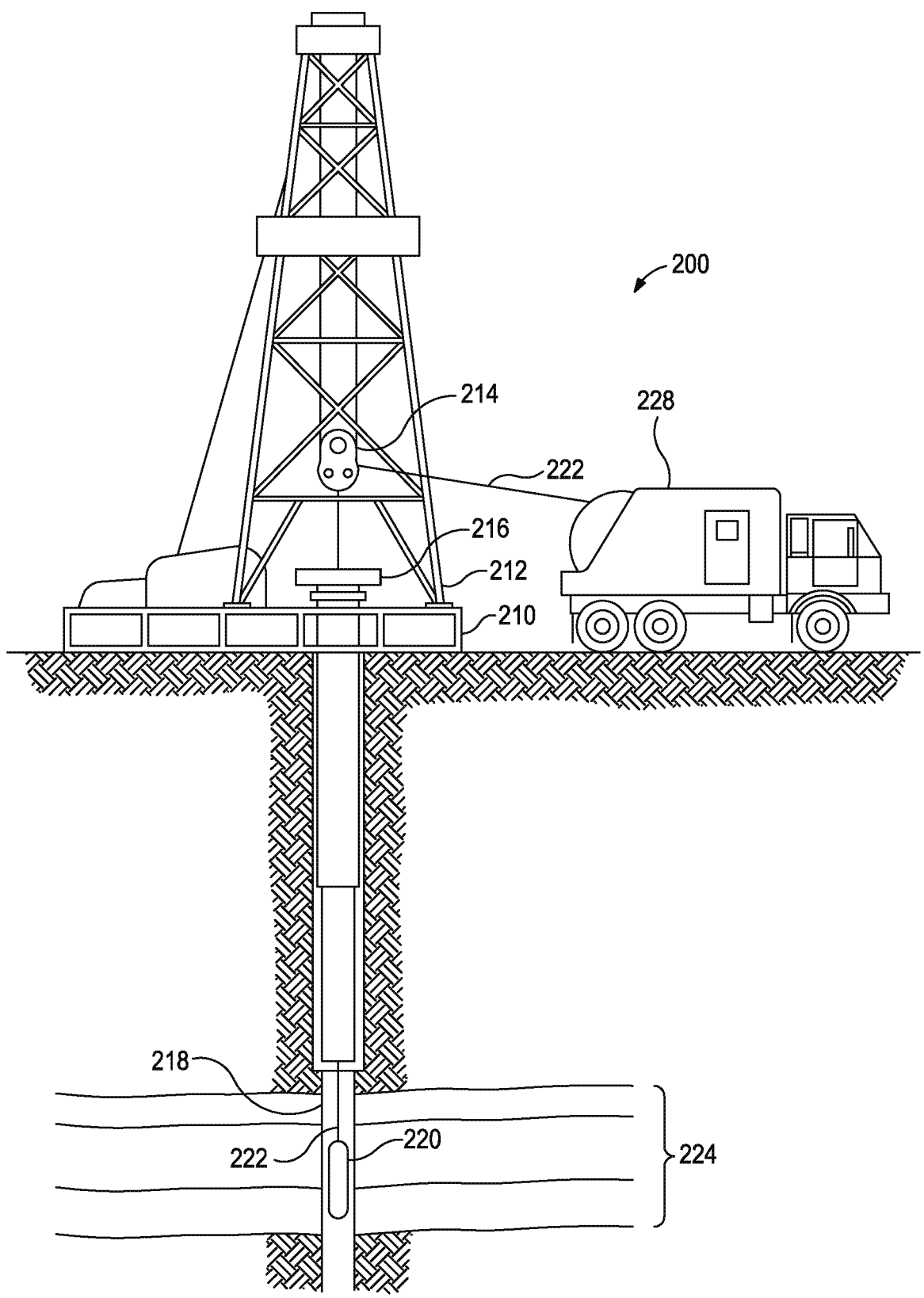
FIG. 4 illustrates a wireline system suitable for implementing the NMR analysis methods described herein.

FIG. 4, for example, illustrates a logging assembly 200 having a wireline system suitable for implementing the NMR analysis methods described herein. As illustrated, a platform 210 may be equipped with a derrick 212 that supports a hoist 214. Drilling oil and gas wells, for example, are commonly carried out using a string of drill pipes connected together so as to form a drilling string that is lowered through a rotary table 216 into a wellbore 218. Here, it is assumed that the drilling string has been temporarily removed from the wellbore 218 to allow an NMR tool 220 to be lowered by wireline 222, slickline, or logging other cable into the wellbore 218. Typically, the NMR tool 220 is lowered to a region of interest and subsequently pulled upward at a substantially constant speed. During the upward trip, instruments included in the NMR tool 220 may be used to perform measurements on the subterranean formation 224 adjacent the wellbore 218 as the NMR tool 220 passes by.

The NMR relaxation data may be communicated to a logging facility 228 for storage, processing, and analysis. The logging facility 228 may be provided with electronic equipment for various types of signal processing including a control system or processor similar to processor 138 of FIG. 1 for performing the NMR analysis methods described herein.

Embodiments disclosed herein include Embodiment A, Embodiment B, Embodiment C, and Embodiment D.

Embodiment A is a method that comprises: introducing a nuclear magnetic (NMR) tool into a wellbore penetrating a subterranean formation; measuring an apparent porosity of (1) a shallow sensitive volume ($\phi_{sh}$) at a first radial distance from the NMR tool and (2) a deep sensitive volume ($\phi_{deep}$) at a second radial distance from the NMR tool, wherein the first radial distance is less than the second radial distance; and calculating a porosity ($\phi$) of the portion of the subterranean formation subterranean formation based on a comparison of the $\phi_{sh}$ and the $\phi_{deep}$.

Embodiment B is a system that comprise: a nuclear magnetic resonance (NMR) tool; a memory communicably coupled to the NMR tool, wherein the memory stores software that, when executed, causes the processing unit to: measure via the NMR tool an apparent porosity of (1) a shallow sensitive volume ($\phi_{sh}$) in a subterranean formation at a first radial distance from the NMR tool and (2) a deep sensitive volume ($\phi_{deep}$) in the subterranean formation at a second radial distance from the NMR tool, wherein the first radial distance is less than the second radial distance; and calculate a porosity ($\phi$) of the portion of the subterranean formation based on a comparison of the $\phi_{sh}$ and the $\phi_{deep}$.

Embodiments A and B may optionally include one or more of the following: Element 1: wherein calculating the $\phi$ is according to according to $C*\phi_{app}=(S_w*HI_w+S_o*HI_o+S_g*HI_g)*\phi$, where an apparent porosity ($\phi_{app}$) is based on the comparison of the $\phi_{sh}$ and the $\phi_{deep}$, C is a calibration constant, HI is a hydrogen index, and S is a saturation and where subscripts w, o, and g are water, oil, and gas components, respectively, of a fluid in a sensitive volume being measured; Element 2: Element 1 and wherein the subterranean formation is a liquid-bearing subterranean formation, and wherein the comparison of the $\phi_{sh}$ and the $\phi_{deep}$ is: (1) if $\phi_{sh} > \phi_{deep}$, use the $\phi_{deep}$ for the $\phi_{app}$; (2) if $\phi_{sh} < \phi_{deep}$, use the $\phi_{deep}$ for the $\phi_{app}$; and (3) if $\phi_{sh} \cong \phi_{deep}$, use the $\phi_{sh}$, the $\phi_{deep}$, or an average thereof for the $\phi_{app}$; Element 3: Element 1 and wherein the subterranean formation is a gas-bearing subterranean formation, and wherein the drilling mud has a characteristic drilling mud NMR signal ($NMR_{mud}$), a characteristic non-wetting mud filtrate NMR signal ($NMR_{nw}$), or both, wherein the $NMR_{mud}$ and $NMR_{nw}$ are a spin-lattice relaxation ($T_1$), a spin-spin relaxation ($T_2$), or a Carr-Purcell-Meiboom-Gill (CPMG) echo train, the comparison of $\phi_{sh}$ and $\phi_{deep}$ is: (1) if $\phi_{sh} > \phi_{deep}$ and the $NMR_{mud}$ is not detected in the shallow or deep sensitive volumes, use the $\phi_{sh}$ for the $\phi_{app}$; (2) if $\phi_{sh} > \phi_{deep}$ and the $NMR_{mud}$ is detected in the shallow sensitive volume but not detected in the deep sensitive volume, calculate $\phi_{app}$ according to $$\phi_{app} = \phi_{bw,deep} + \phi_{mv,sh}\left(\frac{\phi_{mud} - \phi_{bw,deep}}{\phi_{mud} - \phi_{bw,sh}}\right),$$

where $\phi_{bw,deep}$ is a non-movable porosity of the deep sensitive volume, $\phi_{mv,sh}$ is a movable porosity of the shallow sensitive volume, $\phi_{mud}$ is a porosity of the drilling mud, and $\phi_{bw,sh}$ is a non-movable porosity of the shallow sensitive volume; (3) if $\phi_{sh} < \phi_{deep}$ and a long relaxation component in the $\phi_{sh}$ decreases and a short relaxation component in the $\phi_{sh}$ increases relative to the $\phi_{deep}$, use the $\phi_{deep}$ for the $\phi_{app}$; (4) if $\phi_{sh} \cong \phi_{deep}$ and the $NMR_{nw}$ is present in both the shallow and deep sensitive volumes, use the $\phi_{sh}$, the $\phi_{deep}$, or an average thereof for the $\phi_{app}$; and (5) if $\phi_{sh} \cong \phi_{deep}$ and the $NMR_{nw}$ is not present in both the shallow and deep sensitive volumes, either: (A) increase a differential pressure between the drilling mud in the wellbore and the gas-bearing subterranean formation to force the drilling mud into at least a portion of the shallow sensitive volume and perform again the comparison of the $\phi_{sh}$ and the $\phi_{deep}$, or (B) perform a magnetic field gradient-based diffusion analysis to determine the $S_w$ and the $S_g$ and use the $S_w$ and the $S_g$ for calculating the $\phi$ according to the $C^*\phi_{app} = (S_w^*HI_w + S_o^*HI_o + S_g^*HI_g)^*\phi$; and Element 4: the method further comprising: drilling the wellbore, wherein the NMR tool is a logging while drilling (LWD) NMR tool. Exemplary combinations may include, but are not limited to, Element 1 in combination with Element 4; Elements 1 and 2 in combination with Element 4; and Elements 1 and 3 in combination with Element 4.

Embodiment C is a method that comprises: introducing a nuclear magnetic (NMR) tool into a wellbore penetrating a subterranean formation; measuring an apparent porosity of (1) a shallow sensitive volume ($\phi_{sh}$) at a first radial distance from the NMR tool and (2) a deep sensitive volume ($\phi_{deep}$) at a second radial distance from the NMR tool, wherein the first radial distance is less than the second radial distance; and determining a pore type of the portion of the subterranean formation based on a comparison of the $\phi_{sh}$ and the $\phi_{deep}$.

Embodiment D is a system that comprises: a nuclear magnetic resonance (NMR) tool; a memory communicably coupled to the NMR tool, wherein the memory stores software that, when executed, causes the processing unit to: measure via the NMR tool an apparent porosity of (1) a shallow sensitive volume ($\phi_{sh}$) at a first radial distance from the NMR tool and (2) a deep sensitive volume ($\phi_{deep}$) at a second radial distance from the NMR tool, wherein the first radial distance is less than the second radial distance; and determine a pore type of the portion of the subterranean formation based on a comparison of the $\phi_{sh}$ and the $\phi_{deep}$.

Embodiments C and D may optionally include one or more of the following: Element 5: wherein the drilling mud having a characteristic NMR property for each of the drilling mud ($NMR_{mud}$), wherein the NMR property is a spin-lattice relaxation ($T_1$), a spin-spin relaxation ($T_2$), or a Carr-Purcell-Meiboom-Gill (CPMG) echo train; the method further comprising: measuring a spin-spin relaxation for the shallow sensitive volume ($T_{2,sh}$) and a spin-spin relaxation for the deep sensitive volume ($T_{2,deep}$); and wherein the comparison of $\phi_{sh}$ and $\phi_{deep}$ is: (1) if $\phi_{sh} > \phi_{deep}$ and the $NMR_{mud}$ is not detected in the shallow or deep sensitive volumes, use the $T_{2,sh}$ to determine the pore type; (2) if $\phi_{sh} > \phi_{deep}$ and the $NMR_{mud}$ is detected in the shallow sensitive volume but not detected in the deep sensitive volume use the $T_{2,deep}$ to calculate the pore type; (3) if $\phi_{sh} < \phi_{deep}$ and a long relaxation component in $\phi_{sh}$ decreases and a short relaxation component in $\phi_{sh}$ increases relative to $\phi_{deep}$, use the $T_{2,deep}$ to determine the pore type; and (4) if $\phi_{sh} \cong \phi_{deep}$, use the $T_{2,sh}$, the $T_{2,deep}$, or an average thereof to determine the pore type; Element 6: Element 5 and wherein the $T_{2,sh}$ or the $T_{2,deep}$ are measured using the CPMG echo train, and wherein $\phi_{sh} \cong \phi_{deep}$ and the $T_{2,sh}$ or the $T_{2,deep}$ with a lesser G·TE is used to determine the pore type, wherein G is a magnetic field gradient of the NMR tool for a corresponding sensitive volume and TE is an interecho time for the CPMG echo train; and Element 7: drilling the wellbore, wherein the NMR tool is a logging while drilling (LWD) NMR tool. Exemplary combinations may include, but are not limited to, Element 5 in combination with Element 7; and Elements 5 and 6 in combination with Element 7.

Unless otherwise indicated, all numbers expressing quantities of ingredients, properties such as molecular weight, reaction conditions, and so forth, used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A method comprising:
   introducing a nuclear magnetic resonance (NMR) tool into a wellbore penetrating a subterranean formation;
   measuring an apparent porosity of (1) a shallow sensitive volume ($\phi_{sh}$) at a first radial distance from the NMR tool and (2) a deep sensitive volume ($\phi_{deep}$) at a second radial distance from the NMR tool, wherein the first radial distance is less than the second radial distance; and
   calculating a porosity ($\phi$) of the portion of the subterranean formation based on a comparison of the $\phi_{sh}$ and the $\phi_{deep}$, wherein calculating the $\phi$ is according to $C^*\phi_{app}=(S_w^*HI_w+S_o^*HI_o+S_g^*HI_g)^*\phi$, where an apparent porosity ($\phi_{app}$) is based on the comparison of the $\phi_{sh}$ and the $\phi_{deep}$, C is a calibration constant, HI is a hydrogen index, and S is a saturation and where subscripts w, o, and g are water, oil, and gas components, respectively, of a fluid in a sensitive volume being measured.

2. The method of claim 1 further comprising: drilling the wellbore, wherein the NMR tool is a logging while drilling (LWD) NMR tool.

3. The method of claim 1, wherein the subterranean formation is a liquid-bearing subterranean formation, and wherein the comparison of the $\phi_{sh}$ and the $\phi_{deep}$ is:
   (1) if $\phi_{sh}>\phi_{deep}$, use the $\phi_{deep}$ for the $\phi_{app}$;
   (2) if $\phi_{sh}<\phi_{deep}$, use the $\phi_{deep}$ for the $\phi_{app}$; and
   (3) if $\phi_{sh}\cong\phi_{deep}$, use the $\phi_{sh}$, the $\phi_{deep}$, or an average thereof for the $\phi_{app}$.

4. The method of claim 1, wherein the subterranean formation is a gas-bearing subterranean formation, and wherein a drilling mud has a characteristic drilling mud NMR signal ($NMR_{mud}$), a characteristic non-wetting mud filtrate NMR signal ($NMR_{nw}$), or both, wherein the $NMR_{mud}$ and $NMR_{nw}$ are a spin-lattice relaxation ($T_1$), a spin-spin relaxation ($T_2$), or a Carr-Purcell-Meiboom-Gill (CPMG) echo train, and wherein the comparison of $\phi_{sh}$ and $\phi_{deep}$ is:
   (1) if $\phi_{sh}>\phi_{deep}$ and the $NMR_{mud}$ is not detected in the shallow or deep sensitive volumes, use the $\phi_{sh}$ for the $\phi_{app}$;
   (2) if $\phi_{sh}>\phi_{deep}$ and the $NMR_{mud}$ is detected in the shallow sensitive volume but not detected in the deep sensitive volume, calculate $\phi_{app}$ according to $$\phi_{app} = \phi_{bw,deep} + \phi_{mv,sh}\left(\frac{\phi_{mud} - \phi_{bw,deep}}{\phi_{mud} - \phi_{bw,sh}}\right),$$

where $\phi_{bw,deep}$ is a non-movable porosity of the deep sensitive volume, $\phi_{mv,sh}$ is a movable porosity of the shallow sensitive volume, $\phi_{mud}$ is a porosity of the drilling mud, and $\phi_{bw,sh}$ is a non-movable porosity of the shallow sensitive volume;
   (3) if $\phi_{sh}<\phi_{deep}$ and a long relaxation component in the $\phi_{sh}$ decreases and a short relaxation component in the $\phi_{sh}$ increases relative to the $\phi_{deep}$, use the $\phi_{deep}$ for the $\phi_{app}$;
   (4) if $\phi_{sh}\cong\phi_{deep}$ and the $NMR_{nw}$ is present in both the shallow and deep sensitive volumes, use the $\phi_{sh}$, the $\phi_{deep}$, or an average thereof for the $\phi_{app}$; and
   (5) if $\phi_{sh}\cong\phi_{deep}$ and the $NMR_{nw}$ is not present in both the shallow and deep sensitive volumes, either:
      (A) increase a differential pressure between the drilling mud in the wellbore and the gas-bearing subterranean formation to force the drilling mud into at least a portion of the shallow sensitive volume and perform again the comparison of the $\phi_{sh}$ and the $\phi_{deep}$, or
      (B) perform a magnetic field gradient-based diffusion analysis to determine the $S_w$ and the $S_g$ and use the $S_w$ and the $S_g$ for calculating the $\phi$ according to the $C^*\phi_{app}=(S_w^*HI_w+S_o^*HI_o+^*S_g^*HI_g)^*\phi$.

5. A system comprising:
   a nuclear magnetic resonance (NMR) tool;
   a memory communicably coupled to the NMR tool, wherein the memory stores software that, when executed, causes a processing unit to:
      measure via the NMR tool an apparent porosity of (1) a shallow sensitive volume ($\phi_{sh}$) in a subterranean formation at a first radial distance from the NMR tool and (2) a deep sensitive volume ($\phi_{deep}$) in the subterranean formation at a second radial distance from the NMR tool, wherein the first radial distance is less than the second radial distance; and
      calculate a porosity ($\phi$) of the portion of the subterranean formation based on a comparison of the $\phi_{sh}$ and the $\phi_{deep}$, wherein calculating the $\phi$ is according to $C^*\phi_{app}=(S_w^*HI_w+S_o^*HI_o+S_g^*HI_g)^*\phi$, where an apparent porosity ($\phi_{app}$) is based on the comparison of the $\phi_{sh}$ and the $\phi_{deep}$, C is a calibration constant, HI is a hydrogen index, and S is a saturation and where subscripts w, o, and g are water, oil, and gas components, respectively, of a fluid in a sensitive volume being measured.

6. The system of claim 5, wherein the subterranean formation is a liquid-bearing subterranean formation, and wherein software causes the processing unit to compare the $\phi_{sh}$ and the $\phi_{deep}$ according to:
   (1) if $\phi_{sh}>\phi_{deep}$, use the $\phi_{deep}$ for the $\phi_{app}$;
   (2) if $\phi_{sh}<\phi_{deep}$, use the $\phi_{deep}$ for the $\phi_{app}$; and (3) if $\phi_{sh} \cong \phi_{deep}$, use the $\phi_{sh}$, the $\phi_{deep}$, or an average thereof for the $\phi_{app}$.

7. The system of claim 5, wherein the subterranean formation is a gas-bearing subterranean formation, and wherein the system further comprises a drilling mud having a characteristic drilling mud NMR signal (NMR$_{mud}$), a characteristic non-wetting mud filtrate NMR signal (NMR$_{nw}$), or both, wherein the NMR$_{mud}$ and NMR$_{nw}$ are a spin-lattice relaxation (T$_1$), a spin-spin relaxation (T$_2$), or a Carr-Purcell-Meiboom-Gill (CPMG) echo train, and wherein software causes the processing unit to compare $\phi_{sh}$ and $\phi_{deep}$ according to:

(1) if $\phi_{sh} > \phi_{deep}$ and the NMR$_{mud}$ is not detected in the shallow or deep sensitive volumes, use the $\phi_{sh}$ for the $\phi_{app}$;

(2) if $>\phi_{deep}$ and the NMR$_{mud}$ is detected in the shallow sensitive volume but not detected in the deep sensitive volume, calculate $\phi_{app}$ according to $$\phi_{app} = \phi_{bw,deep} + \phi_{mv,sh}\left(\frac{\phi_{mud} - \phi_{bw,deep}}{\phi_{mud} - \phi_{bw,sh}}\right),$$

where $\phi_{bw,deep}$ is a non-movable porosity of the deep sensitive volume, $\phi_{mv,sh}$ is a movable porosity of the shallow sensitive volume, $\phi_{mud}$ is a porosity of the drilling mud, and $\phi_{bw,sh}$ is a non-movable porosity of the shallow sensitive volume, (3) if $\phi_{sh} < \phi_{deep}$ and a long relaxation component in the $\phi_{sh}$ decreases and a short relaxation component in the $\phi_{sh}$ increases relative to the $\phi_{deep}$, use the $\phi_{deep}$ for the $\phi_{app}$;

(4) if $\phi_{sh} \cong \phi_{deep}$ and the NMR$_{nw}$ is present in both the shallow and deep sensitive volumes, use the $\phi_{sh}$, the $\phi_{deep}$, or an average thereof for the $\phi_{app}$; and (5) if $\phi_{sh} \cong \phi_{deep}$ and the NMR$_{nw}$ is not present in both the shallow and deep sensitive volumes, either:

(A) increase a differential pressure between the drilling mud in the wellbore and the gas-bearing subterranean formation to force the drilling mud into at least a portion of the shallow sensitive volume and perform again the comparison of the $\phi_{sh}$ and the $\phi_{deep}$, or (B) perform a magnetic field gradient-based diffusion analysis to determine the S$_w$ and the S$_g$ and use the S$_w$ and the S$_g$ for calculating the $\phi$ according to the $C*\phi_{app} = (S_w*HI_w + S_o*HI_o + S_g*HI_g)*\phi$.

8. A method comprising:

introducing a nuclear magnetic resonance (NMR) tool into a wellbore penetrating a subterranean formation;

measuring an apparent porosity of (1) a shallow sensitive volume ($\phi_{sh}$) at a first radial distance from the NMR tool and (2) a deep sensitive volume ($\phi_{deep}$) at a second radial distance from the NMR tool, wherein the first radial distance is less than the second radial distance; and determining a pore type of a portion of the subterranean formation based on a comparison of the $\phi_{sh}$ and the $\phi_{deep}$, wherein calculating the $\phi$ is according to $C*\phi_{app} = (S_w*HI_w + S_o*HI_o + S_g*HI_g)*\phi$, where an apparent porosity ($\phi_{app}$) is based on the comparison of the $\phi_{sh}$ and the $\phi_{deep}$, C is a calibration constant, HI is a hydrogen index, and S is a saturation and where subscripts w, o, and g are water, oil, and gas components, respectively, of a fluid in a sensitive volume being measured.

9. The method of claim 8 further comprising: drilling the wellbore, wherein the NMR tool is a logging while drilling (LWD) NMR tool.

10. The method of claim 9, wherein a drilling mud having a characteristic NMR property for each of the drilling mud (NMR$_{mud}$), wherein the NMR property is a spin-lattice relaxation (T$_1$), a spin-spin relaxation (T$_2$), or a Carr-Purcell-Meiboom-Gill (CPMG) echo train;

the method further comprising: measuring a spin-spin relaxation for the shallow sensitive volume (T$_{2,sh}$) and a spin-spin relaxation for the deep sensitive volume (T$_{2,deep}$); and wherein the comparison of $\phi_{sh}$ and $\phi_{deep}$ is:

(1) if $\phi_{sh} > \phi_{deep}$ and the NMR$_{mud}$ is not detected in the shallow or deep sensitive volumes, use the T$_{2,sh}$ to determine the pore type;

(2) if $\phi_{sh} > \phi_{deep}$ and the NMR$_{mud}$ is detected in the shallow sensitive volume but not detected in the deep sensitive volume use the T$_{2,deep}$ to calculate the pore type;

(3) if $\phi_{sh} < \phi_{deep}$ and a long relaxation component in $\phi_{sh}$ decreases and a short relaxation component in $\phi_{sh}$ increases relative to $\phi_{deep}$, use the T$_{2,deep}$ to determine the pore type; and (4) if $\phi_{sh} \cong \phi_{deep}$, use the T$_{2,sh}$, the T$_{2,deep}$, or an average thereof to determine the pore type.

11. The method of claim 10, wherein the T$_{2,sh}$ or the T$_{2,deep}$ are measured using the CPMG echo train, and wherein $\phi_{sh} \cong \phi_{deep}$ and the T$_{2,sh}$ or the T$_{2,deep}$ with a lesser G·TE is used to determine the pore type, wherein G is a magnetic field gradient of the NMR tool for a corresponding sensitive volume and TE is an interecho time for the CPMG echo train.

12. A system comprising:

a nuclear magnetic resonance (NMR) tool;

a memory communicably coupled to the NMR tool, wherein the memory stores software that, when executed, causes a processing unit to:

measure via the NMR tool an apparent porosity of (1) a shallow sensitive volume ($\phi_{sh}$) at a first radial distance from the NMR tool and (2) a deep sensitive volume ($\phi_{deep}$) at a second radial distance from the NMR tool, wherein the first radial distance is less than the second radial distance; and determine a pore type of the portion of the subterranean formation based on a comparison of the $\phi_{sh}$ and the $\phi_{deep}$, wherein calculating the $\phi$ is according to $C*\phi_{app} = (S_w*HI_w + S_o*HI_o + S_g*HI_g)*\phi$, where an apparent porosity ($\phi_{app}$) is based on the comparison of the $\phi_{sh}$ and the $\phi_{deep}$, C is a calibration constant, HI is a hydrogen index, and S is a saturation and where subscripts w, o, and g are water, oil, and gas components, respectively, of a fluid in a sensitive volume being measured.

13. The system of claim 12, wherein the system further comprises a drilling mud having a characteristic NMR property for each of the drilling mud (NMR$_{mud}$), wherein the NMR property is a spin-lattice relaxation (T$_1$), a spin-spin relaxation (T$_2$), or a Carr-Purcell-Meiboom-Gill (CPMG) echo train;

wherein software causes the processing unit to:

measure via the NMR tool a spin-spin relaxation for the shallow sensitive volume (T$_{2,sh}$) and a spin-spin relaxation for the deep sensitive volume (T$_{2,deep}$); and wherein the comparison of $\phi_{sh}$ and $\phi_{deep}$ is:
  (1) if $\phi_{sh} > \phi_{deep}$ and the $NMR_{mud}$ is not detected in the shallow or deep sensitive volumes, use the $T_{2,sh}$ to determine the pore type;
  (2) if $\phi_{sh} > \phi_{deep}$ and the $NMR_{mud}$ is detected in the shallow sensitive volume but not detected in the deep sensitive volume use the $T_{2,deep}$ to calculate the pore type;
  (3) if $\phi_{sh} < \phi_{deep}$ and a long relaxation component in $\phi_{sh}$ decreases and a short relaxation component in $\phi_{sh}$ increases relative to $\phi_{deep}$, use the $T_{2,deep}$ to determine the pore type; and
  (4) if $\phi_{sh} \cong \phi_{deep}$, use the $T_{2,sh}$, the $T_{2,deep}$, or an average thereof to determine the pore type.

14. The system of claim 13, wherein the $T_{2,sh}$ or the $T_{2,deep}$ are measured using the CPMG echo train, and wherein $\phi_{sh} \cong \phi_{deep}$ and the $T_{2,sh}$ or the $T_{2,deep}$ with a lesser G·TE is used to determine the pore type, wherein G is a magnetic field gradient of the NMR tool for a corresponding sensitive volume and TE is an interecho time for the CPMG echo train.

\* \* \* \* \*